US008953133B2

(12) United States Patent
Cho et al.

(10) Patent No.: US 8,953,133 B2
(45) Date of Patent: Feb. 10, 2015

(54) IN-PLANE SWITCHING MODE LIQUID CRYSTAL DISPLAY DEVICE AND METHOD OF FABRICATING THE SAME

(75) Inventors: Hang-Sup Cho, Paju-si (KR); Young-Sup Jung, Seoul (KR); Jeong-Yun Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 257 days.

(21) Appl. No.: 13/551,383

(22) Filed: Jul. 17, 2012

(65) Prior Publication Data
US 2013/0027646 A1 Jan. 31, 2013

(30) Foreign Application Priority Data

Jul. 30, 2011 (KR) .......................... 10-2011-0076329

(51) Int. Cl.
*G02F 1/1343* (2006.01)
*G02F 1/1335* (2006.01)
*H01L 27/12* (2006.01)

(52) U.S. Cl.
CPC ...... *G02F 1/133512* (2013.01); *G02F 1/13439* (2013.01); *G02F 1/134363* (2013.01); *H01L 27/124* (2013.01); *H01L 27/1259* (2013.01); *G02F 2001/133519* (2013.01); *G02F 2201/40* (2013.01)
USPC .............................. 349/141; 349/39; 349/147

(58) Field of Classification Search
USPC .......................................................... 349/39
See application file for complete search history.

(56) References Cited

U.S. PATENT DOCUMENTS

| 7,576,824 | B2* | 8/2009 | Kim ............................... 349/141 |
| 8,730,445 | B2* | 5/2014 | Ohkubo et al. ................ 349/153 |
| 2005/0200791 | A1* | 9/2005 | Ahn ................................ 349/141 |
| 2009/0032819 | A1* | 2/2009 | Lim et al. .......................... 257/72 |
| 2009/0135351 | A1* | 5/2009 | Lyu et al. ....................... 349/106 |
| 2011/0019144 | A1 | 1/2011 | Koh et al. |

FOREIGN PATENT DOCUMENTS

| CN | 1667477 A1 | 9/2005 |
| CN | 101446705 A | 6/2009 |

* cited by examiner

*Primary Examiner* — Wen-Ying P Chen
(74) *Attorney, Agent, or Firm* — Birch, Stewart, Kolasch & Birch, LLP

(57) ABSTRACT

An IPS mode LCD device includes gate and data lines on a first substrate and crossing to define pixel regions; a thin film transistor connected to the gate lines and the data lines; a first common electrode and a pixel electrode on the first substrate and alternating with each other in each pixel region, each of the first common electrode and the pixel electrode including lower and upper layers; a color filter layer including red, green and blue color filter patterns and on a second substrate, the color filter patterns corresponding to each pixel region; and a liquid crystal layer between the first and second substrates, wherein at least two of the color filter patterns overlap at a boundary of the pixel regions, and wherein the lower layer is made of MoTi, and the upper layer is made of a transparent conductive material or copper nitride.

16 Claims, 12 Drawing Sheets

IN-PLANE SWITCHING MODE LIQUID CRYSTAL DISPLAY DEVICE AND METHOD OF FABRICATING THE SAME

The present application claims the priority benefit of Korean Patent Application No. 10-2011-0076329 filed in Korea on Jul. 30, 2011, which is hereby incorporated by reference for all purposes as if fully set forth herein.

BACKGROUND OF THE INVENTION

1. Field of the Invention

The present invention relates to an in-plane switching (IPS) mode liquid crystal display (LCD) device, and more particularly, to an IPS mode LCD device having improved ambient aperture ratio and image quality and being fabricated by reduced mask processes and a method of fabricating the same.

2. Discussion of the Related Art

The related art liquid crystal display (LCD) device is widely used because of advantages in power consumption and portability and value-added technology. Generally, the LCD device is driven by using optical anisotropy and polarization properties of liquid crystal molecules. The liquid crystal molecules have a definite alignment direction as a result of their thin and long shapes. The alignment direction of the liquid crystal molecules can be controlled by application of an electric field across the liquid crystal molecules. As the intensity or direction of the electric field is changed, the alignment of the liquid crystal molecules also changes. Since incident light is refracted based on the orientation of the liquid crystal molecules due to the optical anisotropy of the liquid crystal molecules, images can be displayed by controlling light transmissivity.

Since the LCD device including a thin film transistor (TFT) as a switching element, referred to as an active matrix LCD (AM-LCD) device, has excellent characteristics such as high resolution and display of moving images, the AM-LCD device has been widely used.

The AM-LCD device includes an array substrate, a color filter substrate and a liquid crystal layer interposed therebetween. The array substrate may include a pixel electrode and TFT, and the color filter substrate may include a color filter layer and a common electrode. The AM-LCD device is driven by an electric field between the pixel electrode and the common electrode resulting in excellent properties of transmittance and aperture ratio. However, since the AM-LCD device uses a vertical electric field, the AM-LCD device has a bad viewing angle.

An in-plane switching (IPS) mode LCD device may be used to resolve the above-mentioned limitations. The related art IPS mode LCD device includes a color filter substrate, an array substrate facing the color filter substrate, and a liquid crystal layer interposed therebetween. Both common and pixel electrode for driving the liquid crystal layer are formed on the array substrate.

FIG. 1 is a schematic cross-sectional view of the related art IPS mode LCD device. Referring to FIG. 1, the IPS mode LCD device includes first and second substrates 9 and 10 facing each other and a liquid crystal layer 11 therebetween.

On the second substrate 10, both of a common electrode 17 and a pixel electrode 30 are formed. The liquid crystal molecules of the liquid crystal layer 11 are driven by a horizontal electric field L generated between the common and pixel electrodes 17 and 30.

FIGS. 2A and 2B are cross-sectional views showing turned on/off conditions of the related art IPS mode LCD device. As shown in FIG. 2A, when the voltage is applied to the IPS mode LCD device, liquid crystal molecules 11a above the common electrode 17 and the pixel electrode 30 are unchanged. But, liquid crystal molecules 11b between the common electrode 17 and the pixel electrode 30 are horizontally arranged due to the horizontal electric field "L". Since the liquid crystal molecules are arranged by the horizontal electric field, the IPS mode LCD device has a characteristic of a wide viewing angle.

FIG. 2B shows a condition when the voltage is not applied to the IPS mode LCD device. Because an electric field is not generated between the common and pixel electrodes 17 and 30, the arrangement of liquid crystal molecules 11 is not changed.

FIG. 3 is a cross-sectional view of a portion of the related art IPS mode LCD device. In FIG. 3, the IPS mode LCD device 95 includes a first substrate 40, a second substrate 70 facing the first substrate 40 and a liquid crystal layer 90 therebetween.

On the first substrate 40, a gate line (not shown), a common line (not shown), a data line 50, a thin film transistor (TFT, not shown), a common electrode 62, and a pixel electrode 64 are disposed. The common line is parallel to and spaced apart from the common line. A gate insulating layer 48 is formed on the gate line and the common line. The data line 50 is formed on the gate insulating layer 48 and crosses the gate line to define a pixel region P. The TFT is connected to the gate line and the data line 50 and includes a gate electrode, a semiconductor layer, a source electrode and a drain electrode.

A passivation layer 60 is formed on the TFT and the data line 50 and includes a drain contact hole (not shown) exposing the drain electrode of the TFT. The pixel electrode 64 is formed on the passivation layer 60 and connected to the drain electrode through the drain contact hole. The common electrode 62 is formed on the passivation layer 60 and connected to the common line. The common and pixel electrodes 62 and 64 have a bar shape and are alternately arranged with each other. The common and pixel electrodes 62 and 64 have a single layer of a transparent conductive material or an opaque metallic material.

On the second substrate 70, a black matrix 73, a color filter layer 76 and an overcoat layer 78 are formed. The black matrix 73 has a lattice shape to expose the pixel region P. The color filter layer 76 includes red, green and blue color filter patterns 76a, 76b and 76c corresponding to the pixel region P. The overcoat layer 78 covers the color filter layer 76. Although not shown, a spacer for maintaining a cell gap may be formed on the overcoat layer 78.

When the related art IPS mode LCD device 95 is exposed to ambient light, the common and pixel electrodes 62 and 64 have a reflectance above 60% such that there are rainbow stains and ambient contrast ratio is decreased. As a result, a displaying image quality is degraded.

In addition, the black matrix 73 has a relatively large area considering an align margin of the first and second substrates 40 and 70, an aperture ration is reduced.

SUMMARY OF THE INVENTION

Accordingly, the present invention is directed to an IPS mode LCD device and a method of fabricating the same that substantially obviate one or more of the problems due to limitations and disadvantages of the related art.

An object of the present invention is to provide an IPS mode LCD device having lowered reflectance of ambient light and improved ambient contrast ratio.

Another objection of the present invention is to provide an IPS mode LCD device being capable of reducing fabricating processes.

Additional features and advantages of the invention will be set forth in the description which follows, and in part will be apparent from the description, or may be learned by practice of the invention. These and other advantages of the invention will be realized and attained by the structure particularly pointed out in the written description and claims hereof as well as the appended drawings.

To achieve these and other advantages and in accordance with the purpose of the present invention, as embodied and broadly described herein, an in-plane switching mode liquid crystal display device includes a first substrate including a plurality of pixel regions; a plurality of gate lines on the first substrate; a plurality of data lines on the first substrate and crossing the gate lines to define the plurality of pixel regions; a thin film transistor in each pixel region and connected to one of the plurality of gate lines and one of the plurality of data lines; a first common electrode and a pixel electrode on the first substrate and alternating with each other in each pixel region, each of the first common electrode and the pixel electrode including a lower layer and an upper layer; a second substrate facing the first substrate; a color filter layer including red, green and blue color filter patterns and on the second substrate, the red, green and blue color filter patterns corresponding to each pixel region; and a liquid crystal layer between the first and second substrates, wherein at least two of the red, green and blue color filter patterns overlap each other at a boundary of the pixel regions, and wherein the lower layer is made of molybdenum-titanium alloy (MoTi), and the upper layer is made of a transparent conductive material or copper nitride.

In another aspect of the present invention, a method of fabricating an in-plane switching mode liquid crystal display device includes forming a plurality of gate lines, a plurality of data lines, a thin film transistor, a first common electrode and a pixel electrode on a first substrate including a plurality of pixel regions, the gate and data lines crossing each other to define the plurality of pixel regions, the a thin film transistor disposed in each pixel region and connected to one of the plurality of gate lines and one of the plurality of data lines, the first common electrode and the pixel electrode alternating with each other in each pixel region, and each of the first common electrode and the pixel electrode including a lower layer and an upper layer; forming a color filter layer including red, green and blue color filter patterns on a second substrate, the red, green and blue color filter patterns corresponding to each pixel region; and attaching the first and second substrate with a liquid crystal layer between the first and second substrates, wherein at least two of the red, green and blue color filter patterns overlap each other at a boundary of the pixel regions, and wherein the lower layer is made of molybdenum-titanium alloy, and the upper layer is made of a transparent conductive material or copper nitride.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE ILLUSTRATED EMBODIMENTS

Reference will now be made in detail to the preferred embodiments, examples of which are illustrated in the accompanying drawings.

Figure 1:
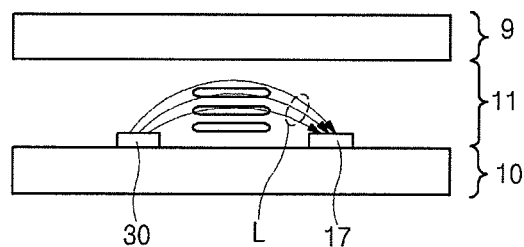
FIG. 1 is a schematic cross-sectional view of the related art IPS mode LCD device.
Figure 2A:
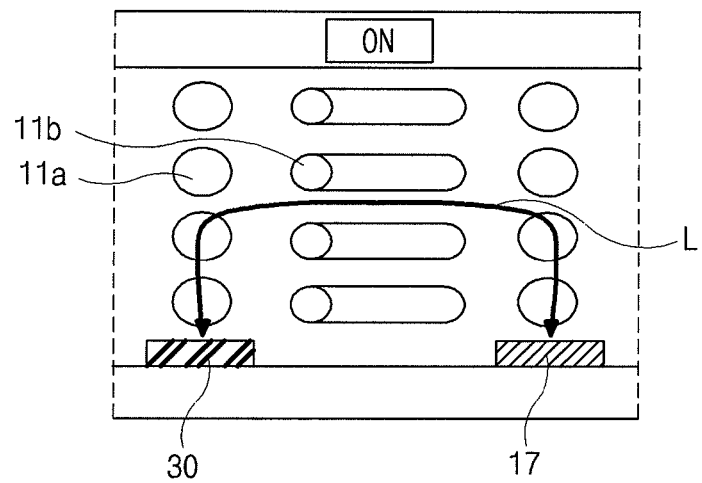
FIGS. 2A and 2B are cross-sectional views showing turned on/off conditions of an IPS mode LCD device according to the related art.
Figure 2B:
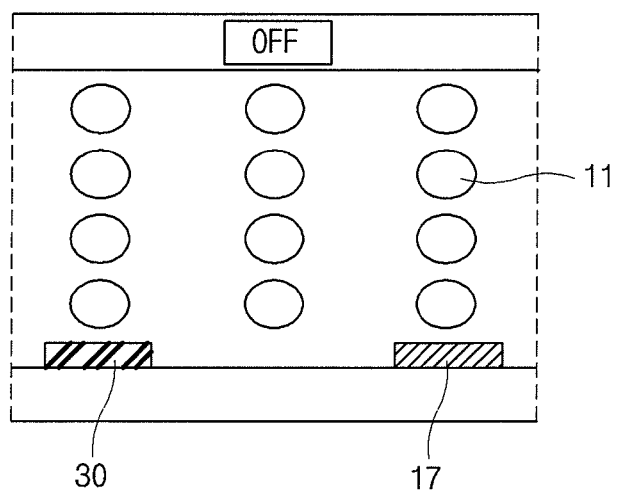
Figure 3:
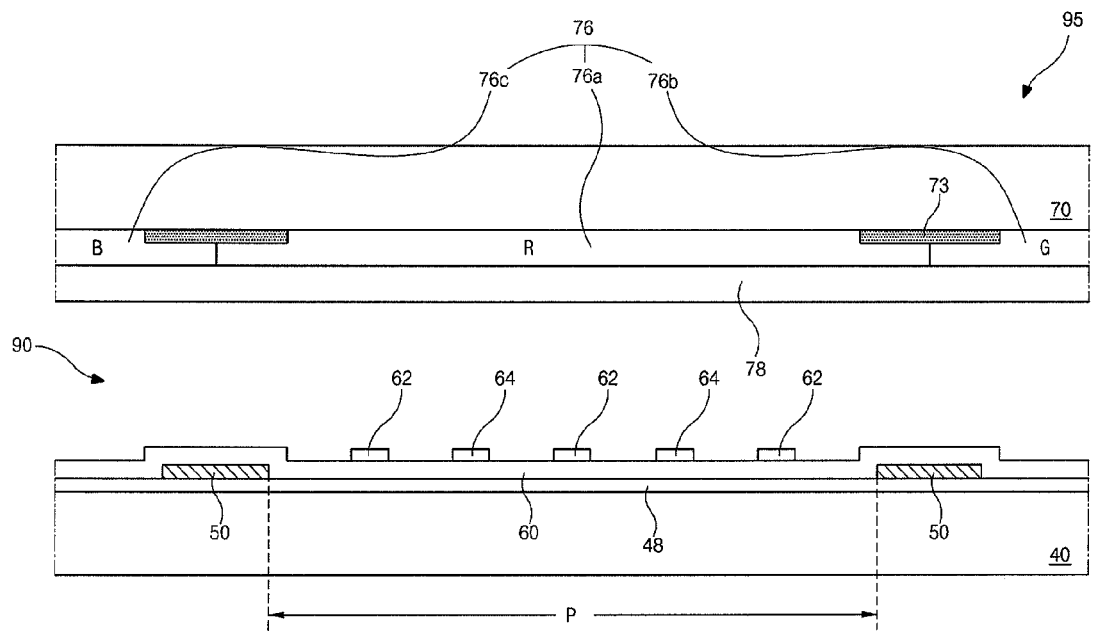
FIG. 3 is a cross-sectional view of a portion of the related art IPS mode LCD device.
Figure 4:
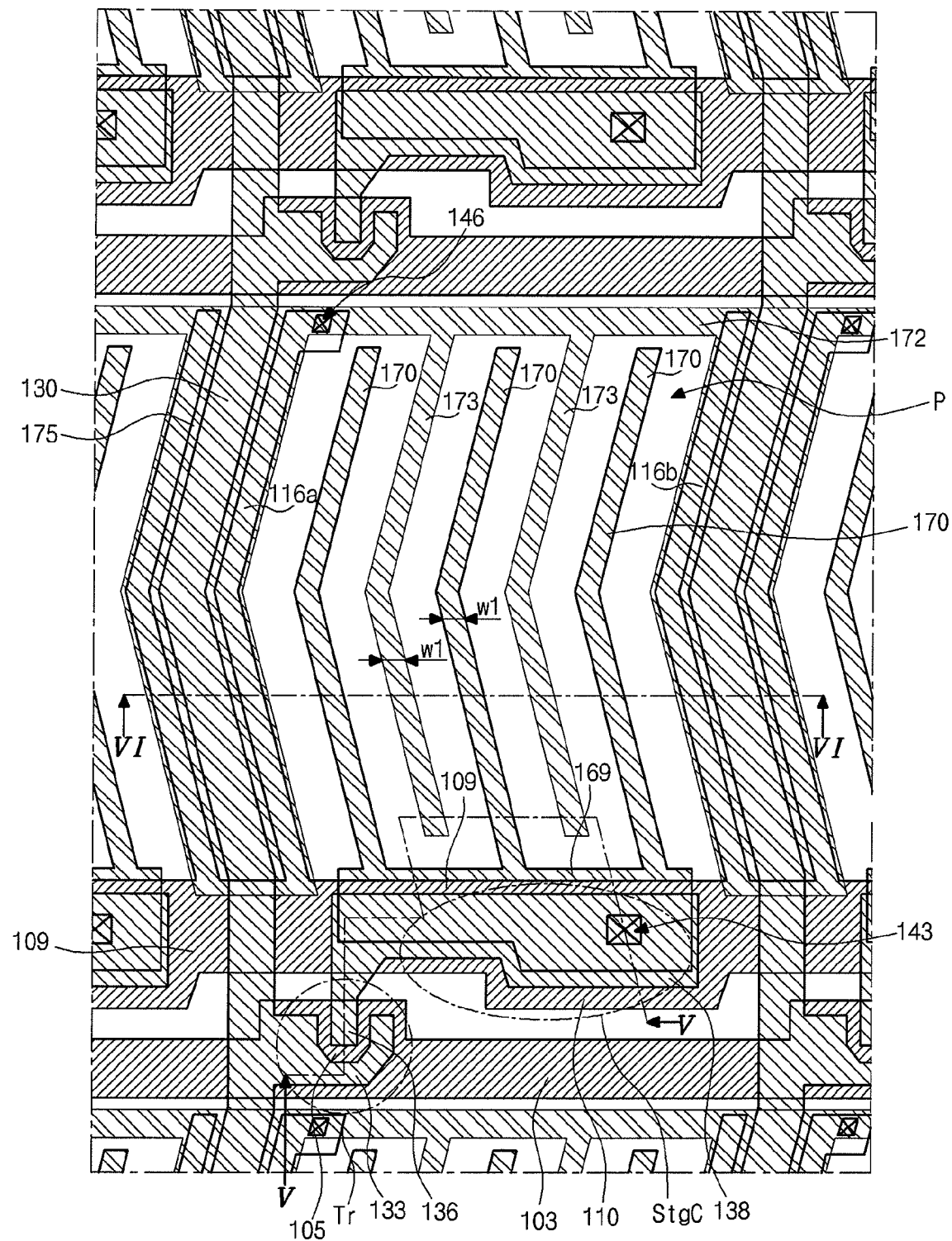
FIG. 4 is a plane view of a portion of an IPS mode LCD device according to the present invention.

FIG. 4 is a plane view of a portion of an IPS mode LCD device according to the present invention. FIG. 4 shows a pixel region including a switching element in an array substrate.

As shown in FIG. 4, an IPS mode LCD device 101 includes a first substrate (not shown), a second substrate (not shown) facing the first substrate and a liquid crystal layer (not shown) therebetween.

On the first substrate as a transparent insulating substrate of glass or plastic, a gate line 103 and a data line 130 are formed. The gate and data lines 103 and 130 cross each other with a gate insulating layer (not shown) therebetween to define a pixel region P. A common line 109, which is parallel to and spaced apart from the gate line 103, is formed on the first substrate. The common line 109 is formed of the same material and on the same layer as the gate line 103.

In the pixel region P, a thin film transistor (TFT) Tr as a switching element is disposed at a crossing portion of the gate and data lines 103 and 130. The TFT Tr is connected to the gate and data lines 103 and 130 and includes a gate electrode 105, the gate insulating layer, a semiconductor layer (not shown), a source electrode 133 and a drain electrode 136.

In the pixel region P, first and second common electrodes 116a and 116b extends from the common line 109 to be parallel to the data line 130. The first and second common electrodes 116a and 116b are disposed at opposite sides of the pixel region P and formed of the same material and on the same layer as the common line 109.

An auxiliary common line 172 is formed to be parallel to the common line 109 and connected to the first common electrode 162a through a common contact hole 146. In FIG. 4, the common contact hole 146 is formed to expose the first common electrode 162a. Alternatively, the common contact hole may correspond to and expose the second common electrode 162b. In this instance, the auxiliary common line 172 is connected to the second common electrode 162b through the common contact hole. At least one third common electrode 173 extends from the auxiliary common line 172 toward the common line 109. The third common electrode 173 is positioned between the first and second common electrodes 162a and 162b in a plane view.

A conductive pattern 175 is positioned over the data line 130 and the first and second common electrodes 116a and 116b respectively in two adjacent pixel regions P. Namely, the conductive pattern 175 shields the data line 130, the first and second common electrodes 116a and 116b and a space therebetween. The conductive pattern 175 extends from the auxiliary common line 172 toward the common line 109.

In FIG. 4, the auxiliary common line 172 runs across the adjacent pixel regions P along the gate line 103. The auxiliary common line 172 overlaps the data line 130 and the first and second common electrodes 162a and 162b. As a result, the auxiliary common line 172 serves as a black matrix for preventing light leakage. Alternatively, the auxiliary common line may have an island shape in each pixel region P.

An auxiliary pixel pattern 169, which is connected to the drain electrode 136 of the TFT Tr through a drain contact hole 143, is formed in the pixel region P. The auxiliary pixel pattern 169 overlaps the common line 109. At least one pixel electrode 170 extends from the auxiliary pixel pattern 169. The pixel electrode 170 is positioned between the first and second common electrodes 162a and 162b and alternately arranged with the third common electrode 173.

The pixel electrode 170 and the common electrodes, which includes the first, second and third common electrodes 116a, 116b and 173, have a bent shape with respect to a virtual center line parallel to the gate line 103 such that the pixel region P has a double-domain structure. As a result, a color shift problem depending on a viewing angle is prevented. In addition, the data line 130 has a bent shape similar to the pixel electrode 170. Since the data line 130 extends along the pixel regions P in a column, the data line 130 has a zigzag shape. Alternatively, the data line 130, the pixel electrode 170 and the common electrodes 116a, 116b and 173 may have other shape such as a straight linear shape.

On the other hand, the drain electrode 136 extends to overlap the common line 109 with the gate insulating layer therebetween. The overlapped portion of the common line 109 serves as a first storage electrode 110, and the overlapped portion of the drain electrode 136 serves as a second storage electrode 138. The first and second storage electrodes 110 and 138 and the gate insulating layer constitute a storage capacitor StgC.

In the IPS mode LCD device according to the present invention, to reduce reflectance of ambient light by the pixel electrode 170 and the third common electrode 173, the pixel electrode 170 and the third common electrode 173 include a double-layered structure.

In the double-layered structure of the pixel electrode 170 and the third common electrode 173, a lower layer includes molybdenum-titanium alloy (MoTi), and an upper layer includes a transparent conductive material, e.g., indium-tin-oxide (ITO), indium-zinc-oxide (IZO) and aluminum-doped zinc-oxide (AZO), or an opaque metallic material, e.g., copper nitride (CuNx).

On the second substrate, a color filter layer 185 (of FIG. 6) including red, green and blue color filter patterns 185a, 185b and 185c is formed without a black matrix. At least two of the red, green and blue color filter patterns 185a, 185b and 185c overlaps at a boundary of the pixel region P such that the overlapped portion of the color filter layer 185 serves as a black matrix with the conductive pattern 175 on the first substrate. Namely, the overlapped portion of the color filter layer 185 corresponds to the conductive pattern 175 on the first substrate.

Figure 5:
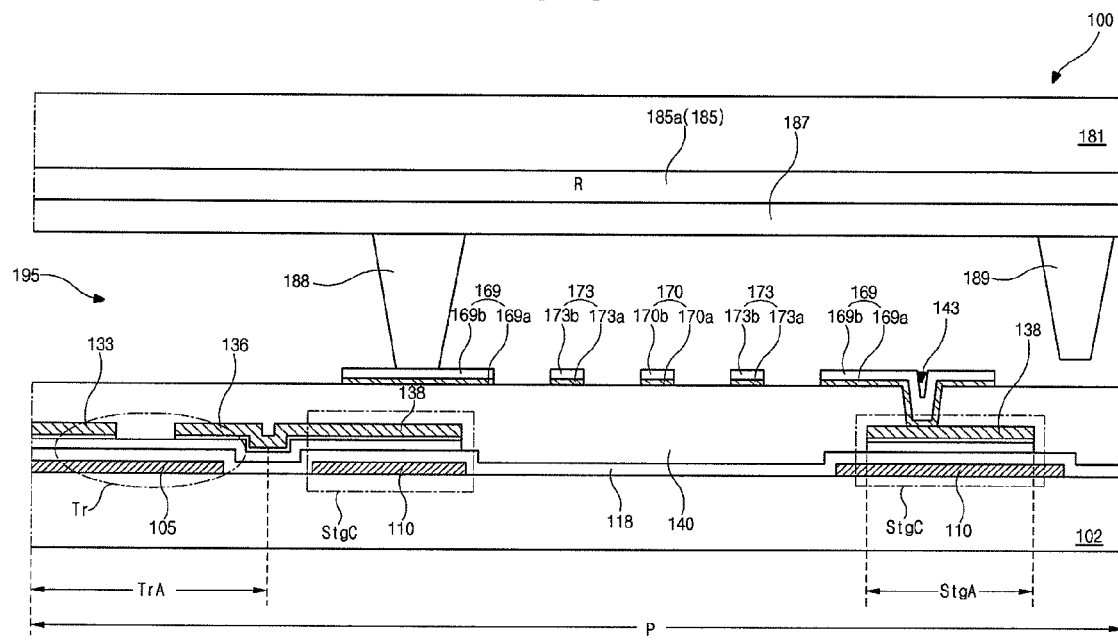
FIG. 5 is a cross-sectional view taken along the line V-V in FIG. 4.
Figure 6:
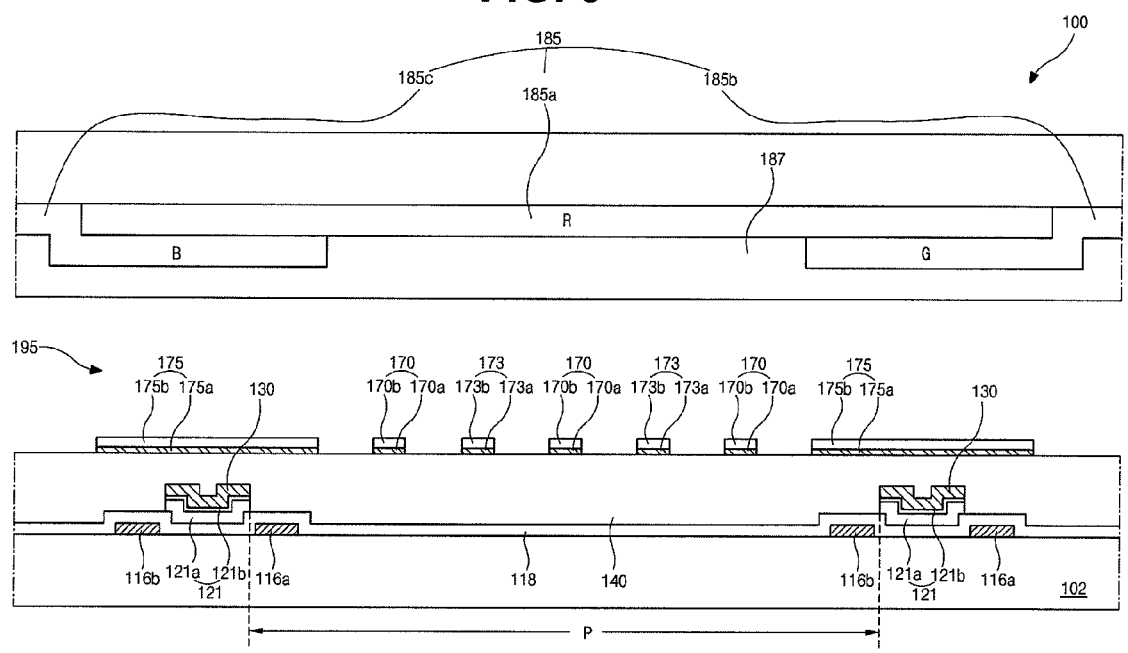
FIG. 6 is a cross-sectional view taken along the line V-V in FIG. 4.

The embodiment of the present invention is further explained with reference to cross-sectional views. FIG. 5 is a cross-sectional view taken along the line V-V in FIG. 4, and FIG. 6 is a cross-sectional view taken along the line V-V in FIG. 4. For the sake of explanation, a switching region, where the TFT is formed, and a storage region, where the storage capacitor is formed, are defined.

Referring to FIGS. 5 and 6, the IPS mode LCD device 100 includes a first substrate 102, on which the pixel electrode 170 and the third common electrode 173 are formed, a second substrate 181, on which the color filter layer 185 is formed, a liquid crystal layer 195 therebetween.

On the first substrate 102, the gate line 103 (of FIG. 4) and the common line 109 (of FIG. 4) are formed. The common line 109 is parallel to and spaced apart from the gate line 103. A portion of the gate line 103 in the switching region TrA serves as the gate electrode 105. Alternatively, the gate line 103 may protrude into the switching region TrA such that the protruding portion of the gate line 103 serves as the gate electrode 105. A portion of the common line 109 in the storage region StgA serves as the first storage electrode 110. The first and second common electrodes 116a and 116b extends from the common line 109 toward the pixel region P.

The gate insulating layer 118 is formed on the gate line 103, the gate electrode 105, the common line 109 and the first and second common electrodes 116a and 116b. For example, the gate insulating layer 118 may be formed of an inorganic insulating material such as silicon oxide and silicon nitride.

The semiconductor layer 120 including an active layer 120a and an ohmic contact layer 120b is formed on the gate insulating layer 118 and in the switching region TrA. The active layer 120a is formed of intrinsic amorphous silicon, and the ohmic contact layer 120b is formed of impurity-doped amorphous silicon.

The data line 130 crosses the gate line 103 to define the pixel region P. In FIG. 6, a semiconductor pattern 121 including first and second patterns 121a and 121b, which respectively extend from the active layer 120a and the ohmic contact layer 120b, is disposed under the data line 130 and on the gate insulating layer 118. These configuration results from a fabricating process. When the data line and the semiconductor layer are formed by different mask processes, the semiconductor pattern does not exist under the data line.

The source electrode 133 extends from the data line 130 to position on the semiconductor layer 120. The drain electrode 136 is also positioned on the semiconductor layer 120 and spaced apart from the source electrode 133.

The gate electrode 105, the gate insulating layer 118, the semiconductor layer 120, the source electrode 133 and the drain electrode 136 constitute the TFT Tr. The TFT Tr is electrically connected to the gate and data lines 103 and 130.

The drain electrode 136 extends into the storage region StgA to overlap the first storage electrode 110 with the gate insulating layer 118 therebetween. The overlapped portion of the drain electrode 136 serves as a second storage electrode 138. The first and second storage electrodes 110 and 138 and the gate insulating layer constitute a storage capacitor StgC.

On the data line 130, the TFT Tr and the storage capacitor StgC, the passivation layer 140 is formed of an organic insulating material having relatively low dielectric constant. For example, the passivation layer 140 may be formed of photoacryl.

To reduce a parasitic capacitance between the conductive pattern 175, which will be formed over the data line 130 and the first and second common electrodes 116a and 116b, and each of the data line 130 and the first and second common electrodes 116a and 116b, the passivation layer 140 is formed a relatively low dielectric constant material. In addition, due to the above passivation layer 140, a undesired electric field between the data line 130 and each of the first and second common electrodes 116a and 116b is minimized.

The passivation layer 140 includes the common contact hole 146 (of FIG. 4) exposing a portion of the first common electrode 116a and the drain contact hole 143 exposing a portion of the second storage electrode 138. Since the second storage electrode 138 is a portion of the drain electrode 136, the drain contact hole 143 may expose the drain electrode 136.

On the passivation layer 140, the auxiliary common line 172 (of FIG. 4) and the auxiliary pixel pattern 169 are formed to be substantially parallel to the gate line 103. The auxiliary common line 172 and the auxiliary pixel pattern 169 are positioned at opposite sides of the pixel region P. The auxiliary pixel pattern 169 and the auxiliary common line 172 have a double-layered structure. The auxiliary pixel pattern 169 includes a lower layer 169a, which is formed of MoTi, and an upper layer 169b, which is formed of the transparent conductive material or the opaque metallic material, and is connected to the second storage electrode 138 through the drain contact hole 143. Although not shown, the auxiliary common line 172 also includes a lower layer of MoTi and an upper layer of the transparent conductive material or the opaque metallic material, and is connected to the first common electrode 116a through the common contact hole 146.

In addition, the conductive pattern 175 and the third common electrode 173 are formed on the passivation layer 140. The conductive pattern 175 and the third common electrode 173 respectively extend from the auxiliary common line 172 toward the common line 109. The conductive pattern 175 overlaps the data line 130 and the first and second common electrodes 116a and 116b to serves as a black matrix. The third common electrode 173 is positioned between the first and second common electrodes 116a and 116b.

Moreover, the pixel electrode 170 is formed on the passivation layer 140. The pixel electrode 170 extends from the auxiliary pixel pattern 169 toward the auxiliary common line 172. The pixel electrode 170 is positioned between the first and second common electrodes 116a and 116b and alternately arranged with the third common electrode 173. As mentioned above, the pixel electrode 170 and the third common electrode 173 have a bent shape or a straight linear shape.

The conductive pattern 175, the third common electrode 173 and the pixel electrode 170 also have a double-layered structure. The conductive pattern 175 includes a lower layer 175a and an upper layer 175b, and the third common electrode 173 includes a lower layer 175a and an upper layer 175b. The pixel electrode 170 includes a lower layer 170a and an upper layer 170b. Each of the lower layers 170a, 173a and 175a is formed of MoTi, and each of the upper layers 170b, 173b and 175b is formed of the transparent conductive material, e.g., ITO, IZO and AZO, or the opaque metallic material, e.g., copper nitride.

Each of the lower layer 170a of the pixel electrode 170 and the upper layer 173a of the common electrode 173 has a thickness of about 50 to 250 angstroms, and each of the upper layer 170b of the pixel electrode 170 and the upper layer 173b of the common electrode 173 has a thickness of about 250 to 600 angstroms. When the pixel electrode 170 and the common electrode 173 has the double-layered structure of the above-mentioned materials and the above-mentioned thicknesses, the IPS mode LCD device 100 has an ambient light reflectance less than about 39%. The related art IPS mode LCD device, which includes the pixel electrode and the common electrode having a single-layered structure of molybdenum and a thickness of about 300 angstroms, has an ambient light reflectance above about 66% such that there is a rainbow stain problem.

However, since the IPS mode LCD device according to an embodiment of the present invention includes the pixel electrode 170 and the common electrode 173, each of which has the double-layered structure including the lower layers 170a and 173a of MoTi and a thickness of 50 to 250 angstroms and the upper layers 170b and 173b of ITO, IZO, AZO or copper nitride and a thickness of 250 to 600 angstroms, the IPS mode LCD device has the ambient light reflectance less than about 39%. As a result, there is no rainbow stain problem and a displaying image quality is improved.

When two layers formed of different material and respectively having a pre-determined thickness, there is a difference in a refractive index such that destructive interference is occurred between lights reflected on a surface of each layers due t the differences in the refractive index and the thickness. Namely, there is an anti-reflection coating effect such that the reflectance is lowered.

On the other hand, when each of the upper layers 170b and 173b is formed of copper nitride, there is no anti-reflection coating effect. However, the copper nitride layer has a low reflection property such the IPS mode LCD device including the copper nitride upper layers 170a and 173a also has that the ambient light reflectance less than about 39%. In addition, when each of the upper layers 170b and 173b is formed of copper nitride, the lower layers 170a and 173a of MoTi is required because an adhesive property between copper nitride and a material of the passivation layer 140 is very bad.

On the second substrate 181, the color filter layer 185 including the red, green and blue color filter patterns 185a, 185b and 185c is formed without a black matrix. The red, green and blue color filter patterns 185a, 185b and 185c respectively correspond to the pixel regions P.

At least two of the red, green and blue color filter patterns 185a, 185b and 185c overlaps at a boundary of the pixel region P such that the overlapped portion of the color filter layer 185 serves as a black matrix with the conductive pattern 175 on the first substrate 102. For example, the red and green color filter patterns 185a and 185b overlap each other at a boundary of one pixel region P, the red and blue color filter patterns 185a and 185c overlap each other at a boundary of another pixel region P, and the green and blue color filter patterns 185b and 185c overlap each other at a boundary of the other pixel region P. The overlapped portion of the color filter layer 185 overlaps the conductive pattern 175. An overcoat layer 187 having a flat top surface is formed on the color filter layer 185. A first column spacer 188 for maintaining a cell gap and a second column spacer 189 for preventing damages by an outer impact are formed on the overcoat layer 187. The first column spacer 188 has a first height lager than a second height of the second column spacer 189.

The liquid crystal layer 195 is positioned between the first and second substrates 102 and 181, and the first and second substrates 102 and 181 are attached such that the first column spacer 188 contacts an uppermost layer over the first substrate 102.

In the above-mentioned IPS mode LCD device, since each of the pixel electrode and the third common electrode includes the double-layered structure including a lower layer of MoTi and an upper layer of ITO, IZO, AZO or copper nitride, an ambient light reflectance is lowered less than about 39%. As a result, a rainbow stain problem in the related art IPS mode LCD device is prevented, and an ambient contrast ratio is improved.

In addition, since there is no black matrix, a fabricating process is simplified and production costs are reduced. Moreover, since each of the pixel electrode and the common electrode has a bent shape, there is a double-domain structure such that a color shift problem is prevented.

A fabricating method of an IPS mode LCD device is explained with reference to FIGS. 7A to 7F, 8A to 8F, 9A to 9F and 10A to 10F.

FIGS. 7A to 7F are cross-section views illustrating a fabricating process of an array substrate portion taken the line V-V in FIG. 4, and FIGS. 8A to 8F are cross-section views illustrating a fabricating process of an array substrate portion taken the line VI-VI in FIG. 5. FIGS. 9A to 9F are cross-section views illustrating a fabricating process of a color filter substrate portion taken the line V-V in FIG. 4, and FIGS. 10A to 10F are cross-section views illustrating a fabricating process of a color filter substrate portion taken the line VI-VI in FIG. 5. For the sake of explanation, a switching region, where the TFT is formed, and a storage region, where the storage capacitor is formed, are defined.

Figure 7A:
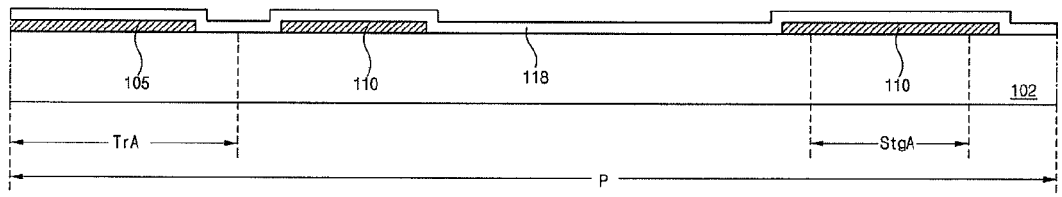
FIGS. 7A to 7F are cross-section views illustrating a fabricating process of an array substrate portion taken the line V-V in FIG. 4.
Figure 8A:
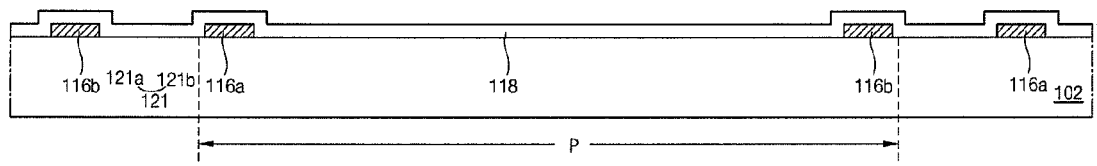
FIGS. 8A to 8F are cross-section views illustrating a fabricating process of an array substrate portion taken the line VI-VI in FIG. 5.

As shown in FIGS. 7A and 8A, a first metal layer (not shown) is formed on the first substrate 102 by depositing at least one of aluminum (Al), Al alloy, copper (Cu), Cu alloy and chromium (Cr). The first metal layer is patterned to form the gate line (not shown), the common line (not shown), the gate electrode 105 and the first and second common electrodes 116a and 116b. The gate electrode 105 is connected to the gate line, and the first and second common electrodes 116a and 116b are respectively connected to the common line.

Next, an inorganic insulating material such as silicon oxide and silicon nitride is deposited on the gate line, the common line, the gate electrode 105 and the first and second common electrodes 116a and 116b to form the gate insulating layer 118.

Figure 7B:
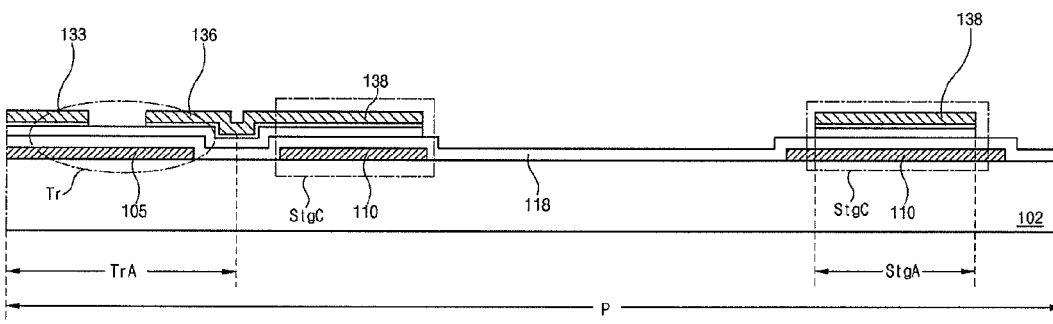
Figure 8B:
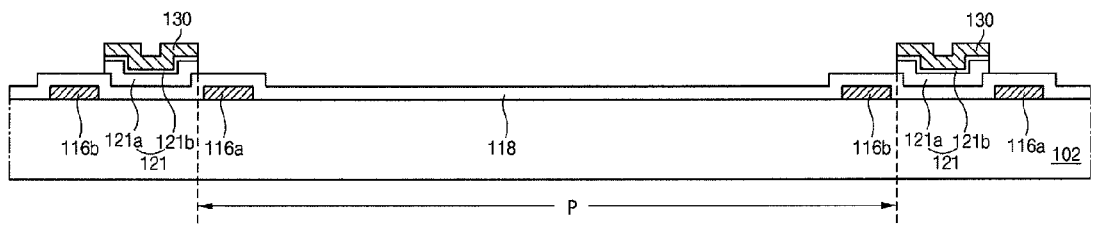

Next, as shown in FIGS. 7B and 8B, an intrinsic amorphous silicon layer (not shown), an impurity-doped amorphous silicon layer (not shown) and a second metal layer (not shown) are sequentially formed on the gate insulating layer 118. The intrinsic amorphous silicon layer, the impurity-doped amorphous silicon layer and the second metal layer are patterned by a refractive exposing mask process or a half-tone mask process to form the semiconductor layer 120 including the active layer 120a, the ohmic contact layer 120b, the data line 130, the source electrode 133 and the drain electrode 136. The semiconductor layer 120 on the gate insulating layer 118 corresponds to the gate electrode 105. As mentioned above, the data line 130 crosses the gate line to define the pixel region P.

The gate electrode 105, the gate insulating layer 118, the semiconductor layer 120, the source electrode 133 and the drain electrode 136 constitute the TFT Tr in the switching region TrA.

In this instance, the drain electrode 136 extends into the storage region StgA to overlap the common line with the gate insulating layer 118 therebetween. The overlapped portion of the common line serves as a first storage electrode 110, and the overlapped portion of the drain electrode 136 serves as a second storage electrode 138. The first and second storage electrodes 110 and 138 and the gate insulating layer constitute a storage capacitor StgC.

Since the semiconductor layer 120, the data line 130, the source electrode 133 and the drain electrode 136 are formed by one mask process, the semiconductor pattern 121 including the first and second patterns 121a and 121b, which respectively extend from the active layer 120a and the ohmic contact layer 120b, is disposed under the data line 130 and on the gate insulating layer 118.

Figure 7C:
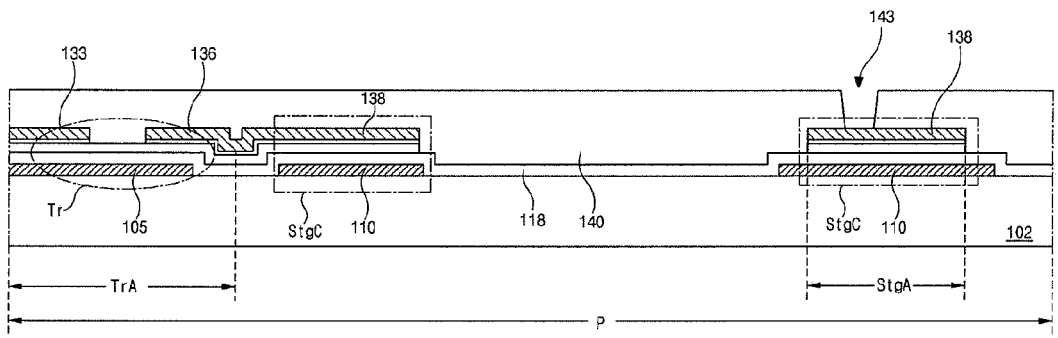
Figure 8C:
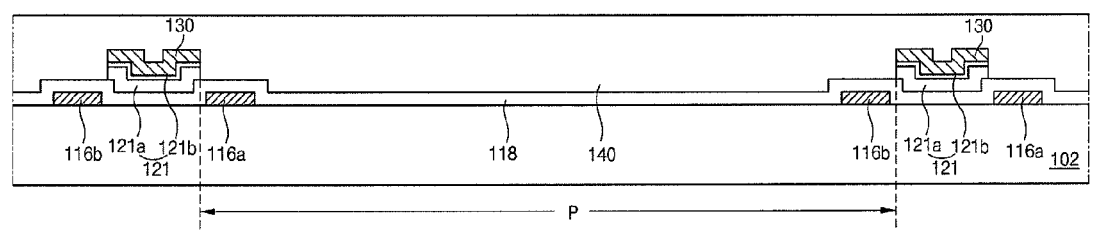

Alternatively, the intrinsic amorphous silicon layer and the impurity-doped amorphous silicon layer may be patterned to form the active layer and the ohmic contact layer by one mask process, and the second metal layer may be patterned by another mask process to form the data line, the source electrode and the drain electrode. In this instance, the semiconductor pattern may not exist under the data line Next, as shown in FIGS. 7C and 8C, the passivation layer 140 is formed by coating an organic insulating material such as photo-acryl on the data line 130, the TFT Tr and the storage capacitor StgC. Then, the passivation layer 140 is patterned by a mask process to form the drain contact hole 143 exposing the second storage electrode 138 and the common contact hole (not shown) exposing the first common electrode 116a. Alternatively, the drain contact hole may expose the drain electrode, and the common contact hole may expose the second common electrode.

Figure 7D:
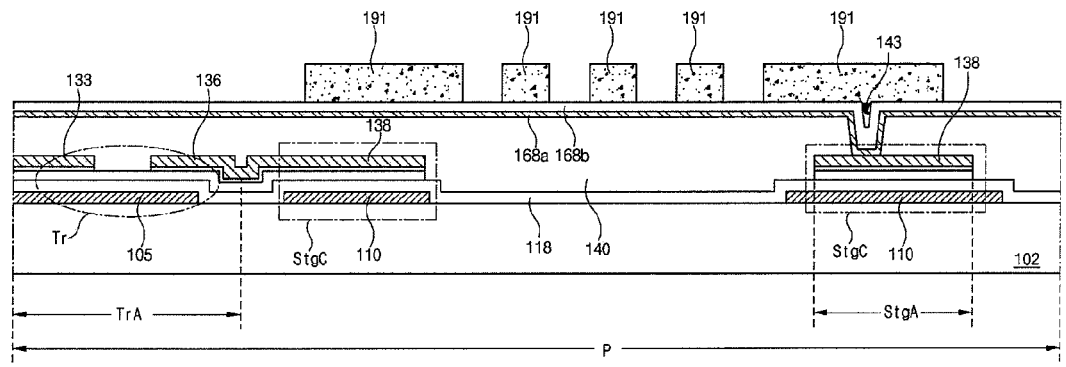
Figure 8D:
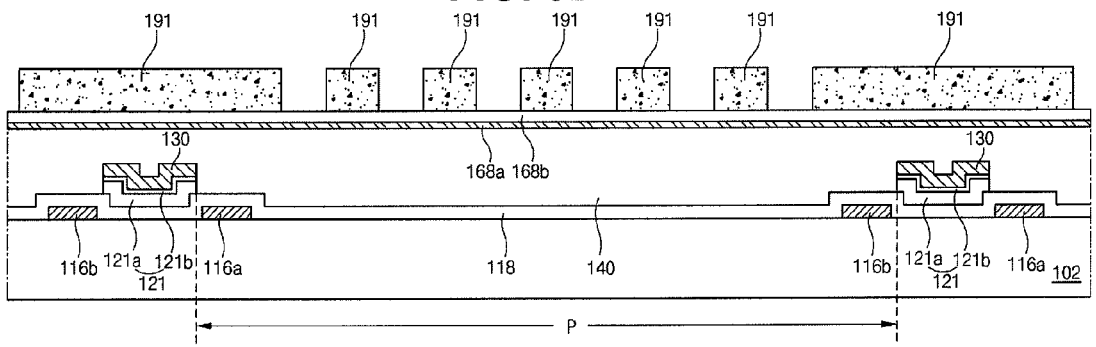

Next, as shown in FIGS. 7D and 8D, a third metal layer 168a having a thickness of about 50 to 250 angstroms is formed on the passivation layer 140 by depositing MoTi, and a fourth metal layer 168b having a thickness of about 250 to 600 angstroms is sequentially formed on the first metal layer 168a by depositing one of ITO, IZO, AZO and copper nitride.

Next, a photoresist (PR) layer (not shown) is formed on the fourth metal layer 168b and patterned to form a PR pattern 191 by exposing and developing the PR layer. The PR pattern 191 corresponds to the third common electrode 173 (of FIG. 7F), the pixel electrode 170 (of FIG. 7F), the auxiliary common line 172 (of FIG. 4), the conductive pattern 175 (of FIG. 8F) and the auxiliary pixel pattern 169 (of FIG. 7F).

Figure 7E:
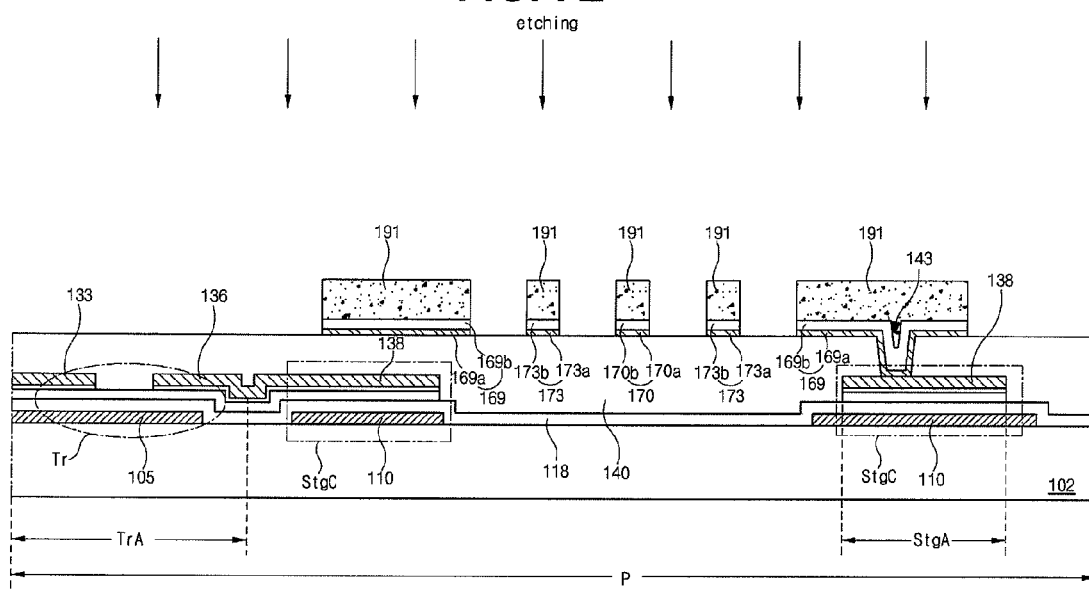
Figure 8E:
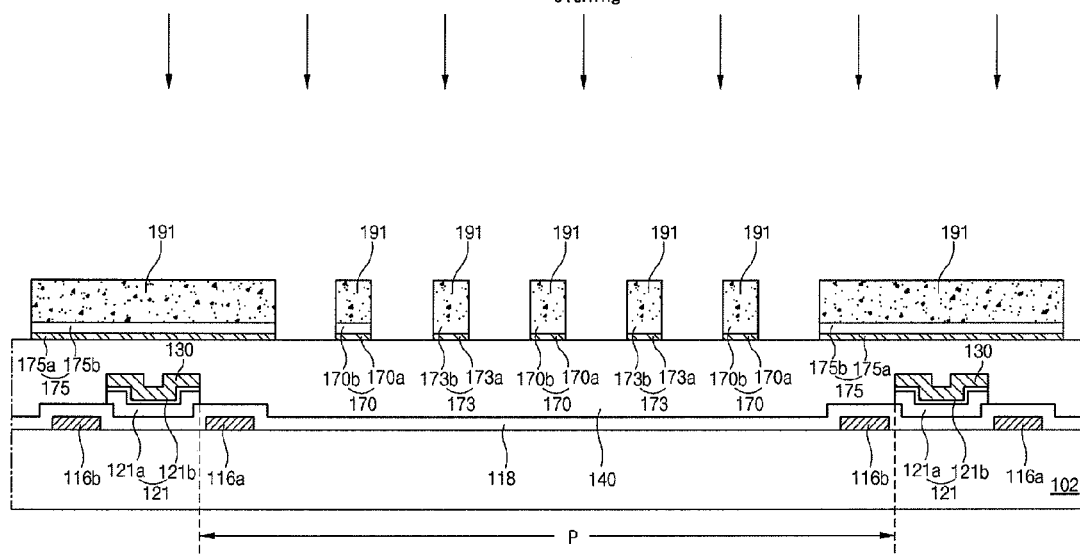

Next, as shown in FIGS. 7E and 8E, the fourth metal layer 168b (of FIG. 7D) and the third metal layer 168a (of FIG. 7D) are etched using the PR pattern 191 as an etching mask to form the pixel electrode 170, the third common electrode 173, the auxiliary pixel pattern 169, the auxiliary common line 172 (of FIG. 4) and the conductive pattern 175 all having a double-layered structure. As mentioned above, the pixel electrode 170 is connected to the auxiliary pixel pattern 169, and the auxiliary pixel pattern 169 is electrically connected to the drain electrode 136 through the drain contact hole 143. The third common electrode 13 and the conductive pattern 175 are respectively connected to the auxiliary common line 172.

Figure 7F:
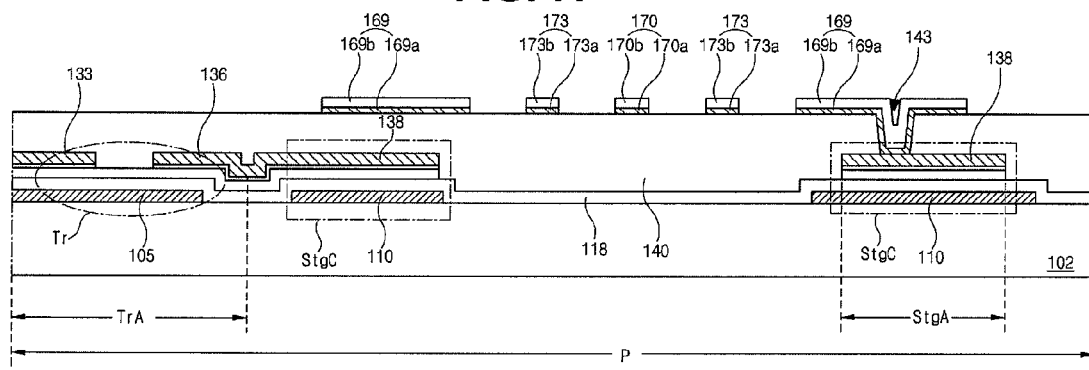
Figure 8F:
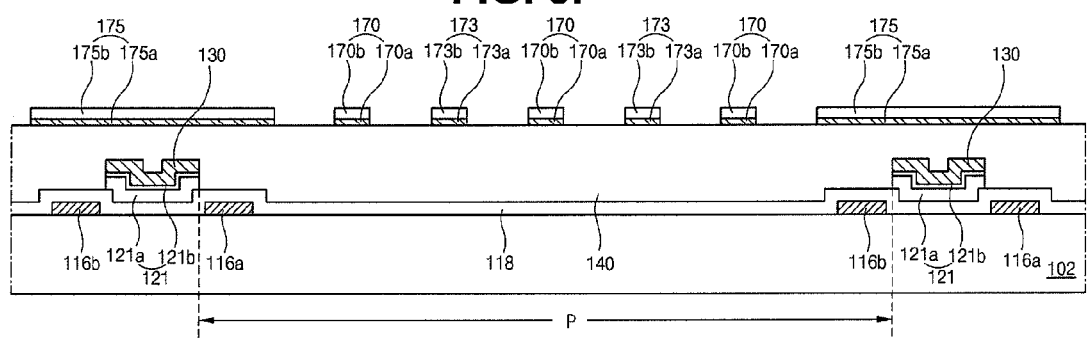

Next, as shown in FIGS. 7F and 8F, by removing the PR pattern 191 on the third common electrode 173, the pixel electrode 170, the auxiliary pixel pattern 169, the auxiliary common line 172 and the conductive pattern 175, the array substrate is obtained.

Figure 9A:
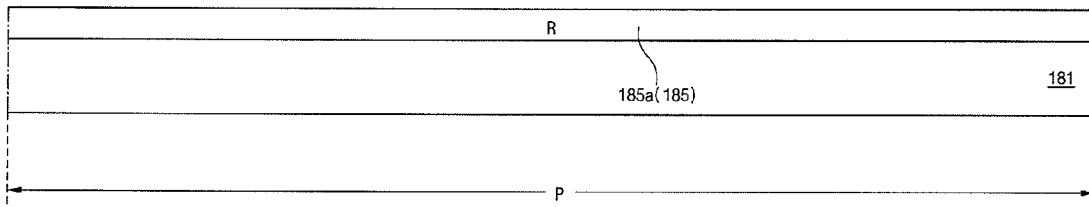
FIGS. 9A to 9F are cross-section views illustrating a fabricating process of a color filter substrate portion taken the line V-V in FIG. 4.
Figure 10A:
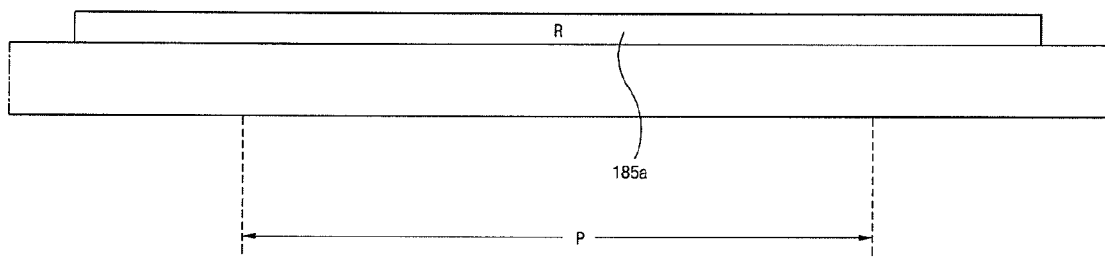
FIGS. 10A to 10F are cross-section views illustrating a fabricating process of a color filter substrate portion taken the line VI-VI in FIG. 5.

On the other hand, as shown in FIGS. 9A and 10A, a red resist layer (not shown) is formed on the second substrate 181 by coating red resist. The red resist layer is patterned by a mask process to form the red color filter pattern 185a in one pixel region P. In this instance, the red color filter pattern 185a extends into a boundary of adjacent pixel region P.

Figure 9B:
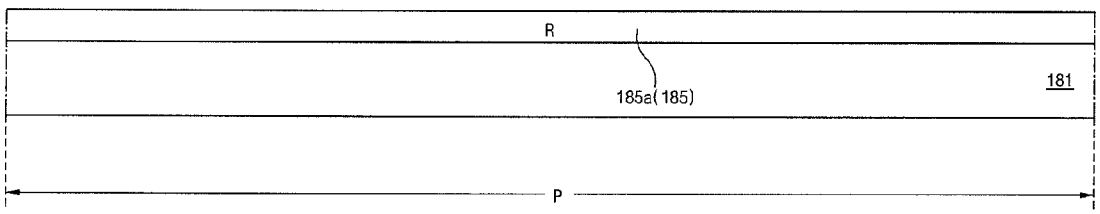
Figure 10B:
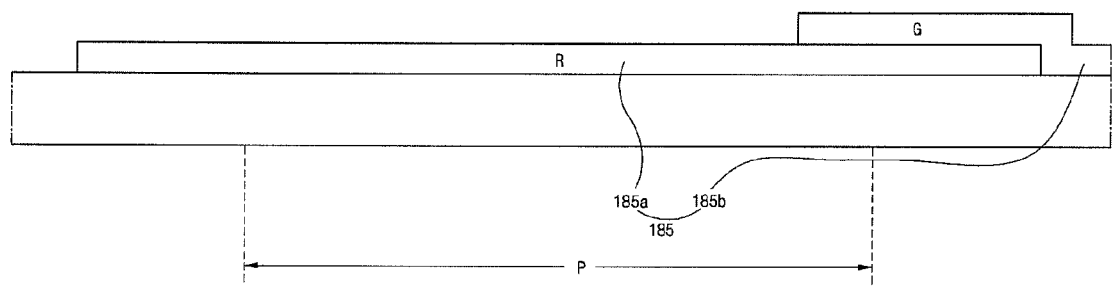

Next, as shown in FIGS. 9B and 10B, a green resist layer (not shown) is formed on the red color filter pattern 185a and the second substrate 181 by coating green resist. The green resist layer is patterned to form the green color filter pattern 185b in another pixel region P. In this instance, the green color filter pattern 185b extends into a boundary of adjacent pixel region P. As a result, the green color filter pattern 185b overlaps the red color filter pattern 185a at the boundary of the pixel regions P where the red and green color filter patterns 185a and 185b are respectively formed.

Figure 9C:
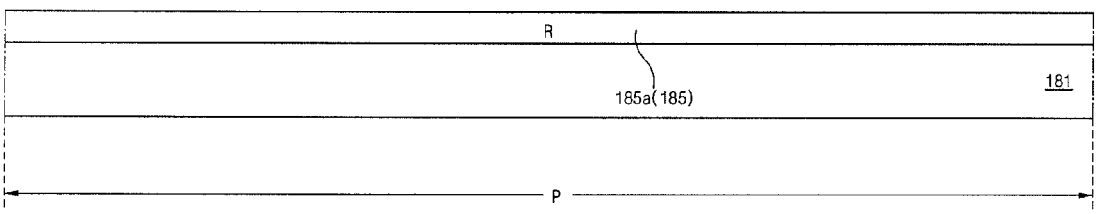
Figure 10C:
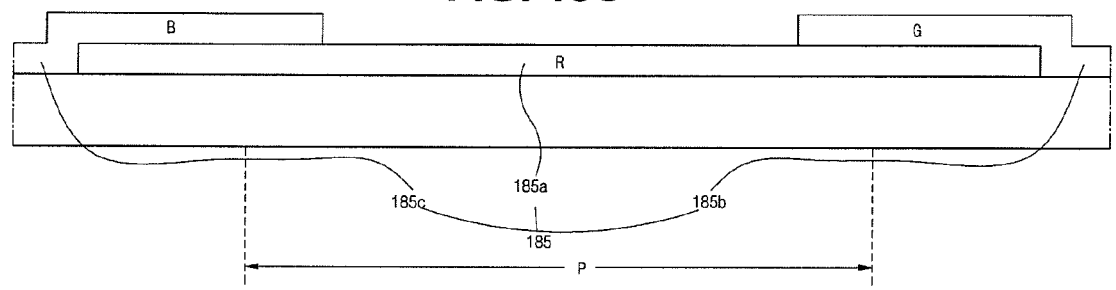

Next, as shown in FIGS. 9C and 10C, a blue resist layer (not shown) is formed on the red and green color filter patterns 185a and 185b and the second substrate 181 by coating blue resist. The blue resist layer is patterned to form the blue color filter pattern 185c in the other pixel region P. In this instance, the blue color filter pattern 185c extends into a boundary of adjacent pixel region P. As a result, the blue color filter pattern 185c overlaps the red color filter pattern 185a at the boundary of the pixel regions P, where the red and blue color filter patterns 185a and 185c are respectively formed, and the green color filter pattern 185b at the boundary of the pixel regions P where the green and blue color filter patterns 185b and 185c are respectively formed.

Two of the red, green and blue color filter patterns 185a, 185b and 185c overlaps at the boundary of the pixel regions P, a light leakage in the boundary is shield by the overlapped portion of the color filter patterns 185a, 185b and 185c. In addition, since the conductive pattern 175 (of FIG. 8F) is formed at the boundary of the pixel regions P and on the first substrate 102 (of FIG. 8F), a light leakage problem is prevented without a black matrix.

Figure 9D:
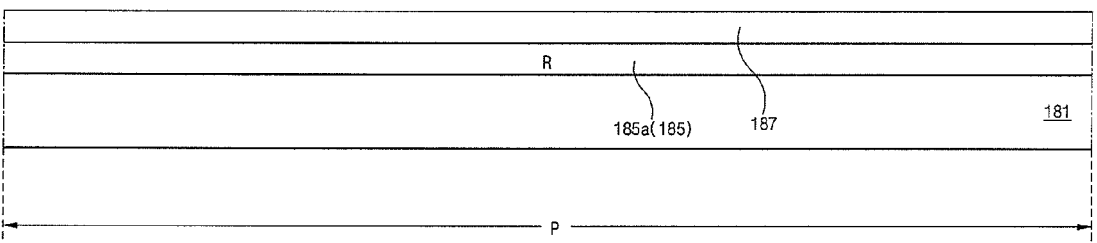
Figure 10D:
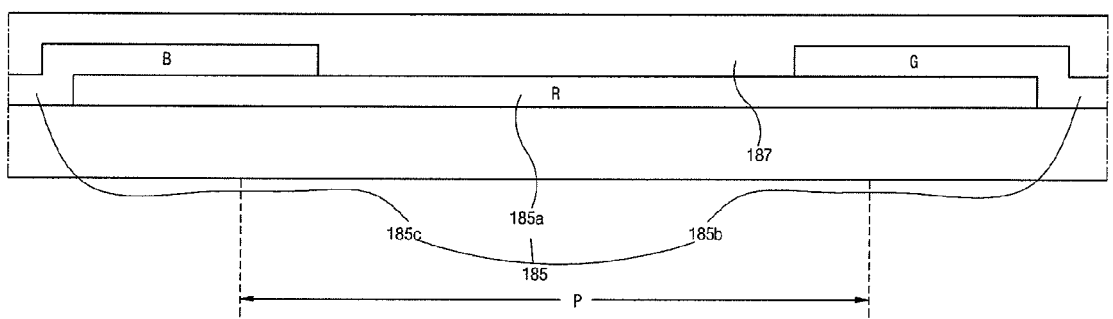

Next, as shown in FIGS. 9D and 10D, a transparent organic insulating material is coated on the color filter layer 185 to form the overcoat layer 187 having a flat top surface.

Figure 9E:
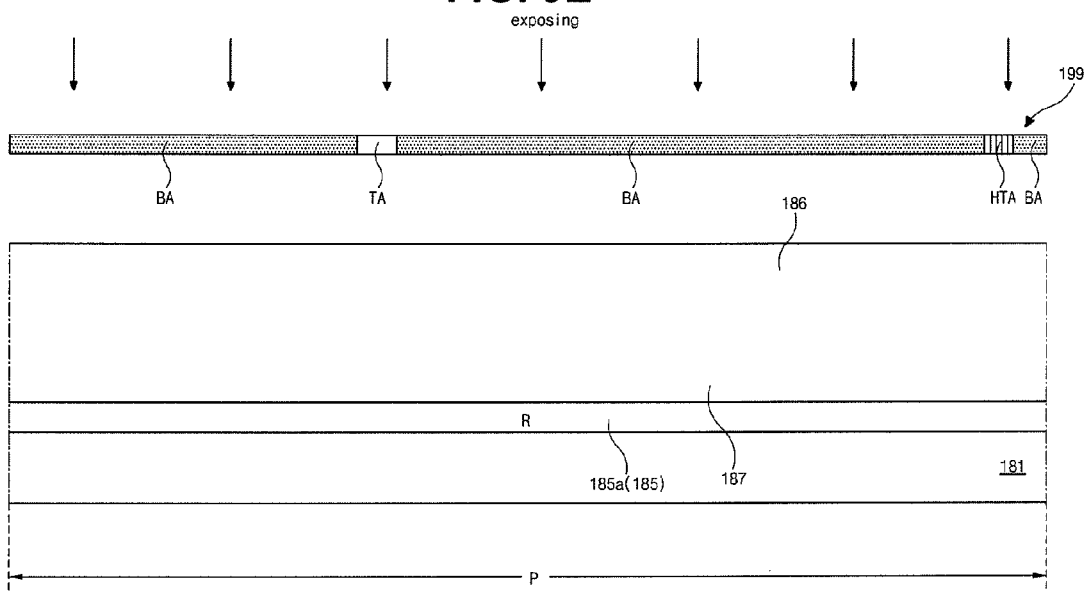
Figure 10E:
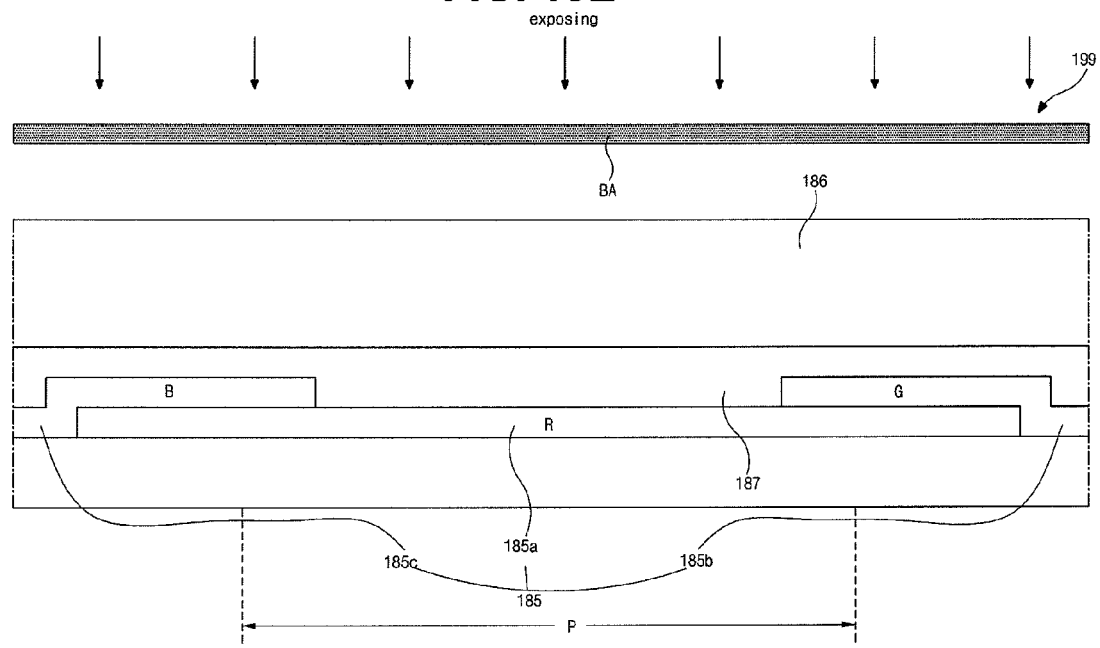

Next, as shown in FIGS. 9E and 10E, an organic material layer 186 is formed on the overcoat layer 187 by coating a photosensitive organic material. An exposed portion of the photosensitive organic material remains by developing. Namely, the organic material has a negative type photosensitive property.

Next, an exposing mask 199 including a transmitting region TA, a block region BA and a half-transmitting region HTA is disposed over the organic material layer 186. The half-transmitting region HTA has a transmittance smaller than the transmitting region TA and larger than the blocking region BA. The organic material layer 186 is exposed through the exposing mask 199.

Figure 9F:
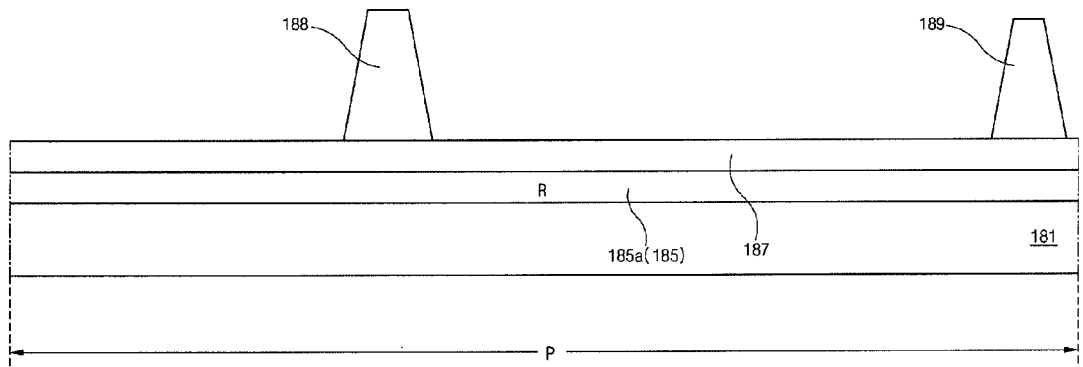
Figure 10F:
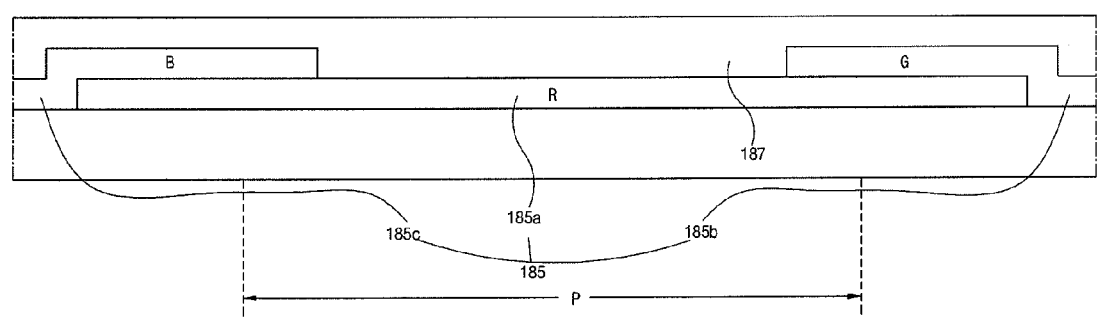

Next, as shown in FIGS. 9F and 10F, the exposed organic material layer 186 (of FIGS. 9E and 10E) is developed to form the first column spacer 188 and the second column spacer 189 such that the color filter substrate is obtained. The first column spacer 188 corresponds to the transmitting region TA of the exposing mask (of FIG. 9E) and has a first height. The second column spacer 189 corresponds to the half-transmitting region HTA of the exposing mask (of FIG. 9E) and has a second height smaller than the first height. As mentioned above, the first column spacer 188 is formed for maintaining a cell gap, and the second column spacer 189 is formed to prevent damages by an outer impact.

The red, green and blue color filter patterns 185a, 185b and 185c are sequentially formed as shown in FIGS. 9A to 9C and 10A to 10C. Alternatively, a forming order of the red, green and blue color filter patterns 185a, 185b and 185c is not limited. In addition, all of the red, green and blue color filter patterns 185a, 185b and 185c may overlaps at the boundary of the pixel regions P.

Referring back to FIGS. 5 and 6, a seal pattern (not shown) is formed on edges of one of the array substrate and the color filter substrate. Next, the liquid crystal layer 195 is disposed in a space surrounding the seal pattern, and the array substrate and the color filter substrate are attached for the first column spacer 188 contact a top element of the array substrate.

Table 1 shows measurement of reflectance for ambient light according to variation of thickness of a molybdenum-titanium (MoTi) lower layer of the LCD device of the embodiment using double-layered pixel and common electrodes each including MoTi lower layer and ITO upper layer. Table 1 also shows reflectance for ambient light of the comparative LCD device using MoTi single-layered pixel and common electrodes.

TABLE 1

| | Thickness (Å) | | Reflectance (%) |
| --- | --- | --- | --- |
| | Lower layer (MoTi) | Upper layer (ITO) | Ambient light (wavelength: 380-780 nm) |
| Embodiment | 300 | 300 | 39 |
| | 200 | 300 | 37 |
| | 100 | 300 | 32 |
| Comparative | 300 | — | 68 |

As shown in Table 1, in the instance of the LCD device of the embodiment of the invention, when the thickness of the ITO upper layer is kept at 300 Å and the thickness of the MoTi lower layer is varied from 100 Å to 300 Å, average reflectances are all 39% or less. Further, the reflectance is less as the thickness of the lower layer is thinner.

However, when the thickness of the lower layer is below 50 Å, an ambient contrast ratio is reduced. Accordingly, it is preferred, but not required, that the thickness of the lower layer is 50 Å or more.

In the instance of the comparative LCD device, the reflectance is 68%. In this instance, rainbow spot occurs, and display quality is thus degraded.

Table 2 shows measurement of reflectance for ambient light according to variation of thickness of an aluminum-doped zinc-oxide (AZO) upper layer of the LCD device of the embodiment using double-layered pixel and common electrodes each including MoTi lower layer and AZO upper layer.

TABLE 2

| | Thickness (Å) | | Reflectance (%) |
| --- | --- | --- | --- |
| | Lower layer (MoTi) | Upper layer (AZO) | Ambient light (wavelength: 380-780 nm) |
| Embodiment | 300 | 300 | 35 |
| | 300 | 400 | 31 |
| | 300 | 500 | 21 |
| | 300 | 600 | 22 |

As shown in Table 2, in the instance of the LCD device of the embodiment, when the thickness of the MoTi lower layer is kept 300 Å and the thickness of the AZO upper layer is varied from 300 Å to 600 Å, average reflectances are all 35% or less. Further, the reflectance is less as the thickness of the lower layer is thicker, and the reflectance is substantially minimized at thicknesses of 500 Å to 600 Å.

In the IPS mode LCD device, the conductive pattern 175 and the overlapped portion of the color filter layer 185 shield the light leakage without a black matrix. As a result, there is an advantage in the production costs. In addition, since each of the pixel electrode 170 and the third common electrode 173 includes the double-layered structure including a lower layer of MoTi and an upper layer of ITO, IZO, AZO or copper nitride, an ambient light reflectance is lowered and an ambient contrast ratio is improved.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. An in-plane switching mode liquid crystal display device, comprising:
   a first substrate including a plurality of pixel regions;
   a plurality of gate lines on the first substrate;
   a plurality of data lines on the first substrate and crossing the gate lines to define the plurality of pixel regions;
   a common line on the first substrate and parallel to the gate line;
   a thin film transistor in each pixel region and connected to one of the plurality of gate lines and one of the plurality of data lines;
   a first common electrode and a pixel electrode on the first substrate and alternating with each other in each pixel region, each of the first common electrode and the pixel electrode including a lower layer and an upper layer;
   second and third common electrodes respectively extending from the common line along the data line;
   a conductive pattern on the first substrate and overlapping the data line and the second and third common electrodes, wherein the conductive pattern is formed of the same material as the first common electrode;
   a second substrate facing the first substrate;
   a color filter layer including red, green and blue color filter patterns and on the second substrate, the red, green and blue color filter patterns corresponding to each pixel region; and
   a liquid crystal layer between the first and second substrates,
   wherein at least two of the red, green and blue color filter patterns overlap each other at a boundary of the pixel regions, wherein the lower layer is made of molybdenum-titanium alloy (MoTi), and the upper layer is made of a transparent conductive material or copper nitride, and wherein the pixel electrode and the first common electrode are located between the second and third common electrodes.

2. The device of claim 1, further comprising a passivation layer on the data line, wherein the first common electrode, the pixel electrode and the conductive pattern is disposed on the passivation layer.

3. The device of claim 2, further comprising:
   an auxiliary common line connected to the first common electrode and the conductive pattern and disposed on the passivation layer; and
   an auxiliary pixel pattern connected to the pixel electrode and disposed on the passivation layer,
   wherein the auxiliary common line and the auxiliary pixel pattern are parallel with the gate line and are opposite to each other in the pixel region.

4. The device of claim 3, wherein each of the auxiliary common line and the auxiliary pixel electrode has a lower layer and an upper layer respectively formed of the same material as the lower layer and the upper layer of the first common electrode.

5. The device of claim 1, further comprising:
   an overcoat layer on the color filter layer;
   a first column spacer on the overcoat layer having a first height; and
   a second column spacer on the overcoat layer having a second height smaller than the first height.

6. The device of claim 1, wherein the transparent conductive material includes one of indium-tin-oxide, indium-zinc-oxide and aluminum-doped zinc-oxide.

7. The device of claim 1, wherein the lower layer has a first thickness of about 50 to 250 angstroms, and the upper layer has a second thickness of about 250 to 600 angstroms.

8. The device according to claim 1, wherein the data line, the pixel electrode, and the first to third common electrodes are bent with respect to a center of the pixel region to form dual domains in the pixel region.

9. A method of fabricating an in-plane switching mode liquid crystal display device, comprising:
   forming a plurality of gate lines, a plurality of data lines, a thin film transistor, a first common electrode and a pixel electrode on a first substrate including a plurality of pixel regions, the gate and data lines crossing each other to define the plurality of pixel regions, the thin film transistor disposed in each pixel region and connected to one of the plurality of gate lines and one of the plurality of data lines, the first common electrode and the pixel electrode alternating with each other in each pixel region, and each of the first common electrode and the pixel electrode including a lower layer and an upper layer, wherein the step of forming the plurality of gate lines, the plurality of data lines, the thin film transistor, the first common electrode and the pixel electrode on the first substrate includes: forming a common line parallel to the gate line; forming second and third common electrodes respectively extending from the common line along the data line; and forming a conductive pattern overlapping the data line and the second and third common electrodes, and wherein the conductive pattern is formed of the same material as the first common electrode;
   forming a color filter layer including red, green and blue color filter patterns on a second substrate, the red, green and blue color filter patterns corresponding to each pixel region; and
   attaching the first and second substrate with a liquid crystal layer between the first and second substrates,
   wherein at least two of the red, green and blue color filter patterns overlap each other at a boundary of the pixel regions, wherein the lower layer is made of molybdenum-titanium alloy, and the upper layer is made of a transparent conductive material or copper nitride, and wherein the pixel electrode and the first common electrode are located between the second and third common electrodes.

10. The method of claim 9, wherein the step of forming the plurality of gate lines, the plurality of data lines, the thin film transistor, the first common electrode and the pixel electrode on the first substrate further includes:
    forming a passivation layer on the data line, wherein the first common electrode, the pixel electrode and the conductive pattern is disposed on the passivation layer.

11. The method of claim 10, wherein the step of forming the plurality of gate lines, the plurality of data lines, the thin film transistor, the first common electrode and the pixel electrode on the first substrate further includes:
    forming an auxiliary common line connected to the first common electrode and the conductive pattern and disposed on the passivation layer; and
    forming an auxiliary pixel pattern connected to the pixel electrode and disposed on the passivation layer,
    wherein the auxiliary common line and the auxiliary pixel pattern are parallel with the gate line and are opposite to each other in the pixel region.

12. The method of claim 11, wherein each of the auxiliary common line and the auxiliary pixel electrode has a lower layer and an upper layer respectively formed of the same material as the lower layer and the upper layer of the first common electrode.

13. The method of claim 9, wherein the step of forming the color filter layer on the second substrate includes:
   forming an overcoat layer on the color filter layer;
   forming a first column spacer on the overcoat layer having a first height; and
   forming a second column spacer on the overcoat layer having a second height smaller than the first height.

14. The method of claim 9, wherein the transparent conductive material includes one of indium-tin-oxide, indium-zinc-oxide and aluminum-doped zinc-oxide.

15. The method of claim 9, wherein the lower layer has a first thickness of about 50 to 250 angstroms, and the upper layer has a second thickness of about 250 to 600 angstroms.

16. The method according to claim 9, wherein the data line, the pixel electrode, and the first to third common electrodes are bent with respect to a center of the pixel region to form dual domains in the pixel region.

* * * * *